(12) United States Patent
Busnaina et al.

(10) Patent No.: US 9,388,047 B2
(45) Date of Patent: Jul. 12, 2016

(54) DIRECTED ASSEMBLY OF CARBON NANOTUBES AND NANOPARTICLES USING NANOTEMPLATES

(75) Inventors: Ahmed Busnaina, Ashland, MA (US); Nicol E. McGruer, Dover, MA (US)

(73) Assignee: Northeastern University, Boston, MA (US)

( * ) Notice: Subject to any disclaimer, the term of this patent is extended or adjusted under 35 U.S.C. 154(b) by 796 days.

(21) Appl. No.: 12/085,883

(22) PCT Filed: Dec. 1, 2006

(86) PCT No.: PCT/US2006/045911
§ 371 (c)(1),
(2), (4) Date: Jun. 2, 2008

(87) PCT Pub. No.: WO2008/054411
PCT Pub. Date: May 8, 2008

(65) Prior Publication Data
US 2009/0087622 A1    Apr. 2, 2009

Related U.S. Application Data

(60) Provisional application No. 60/741,421, filed on Dec. 1, 2005.

(51) Int. Cl.
*B32B 9/00*    (2006.01)
*C01B 31/02*    (2006.01)
(Continued)

(52) U.S. Cl.
CPC ......... *C01B 31/0253* (2013.01); *B81C 1/00031* (2013.01); *B81C 1/00206* (2013.01); *B82B 3/00* (2013.01); *B82Y 30/00* (2013.01); *B82Y 40/00* (2013.01); *B81B 2201/0214* (2013.01);

(Continued)

(58) Field of Classification Search
CPC .................. Y10T 428/2462; Y10T 428/2918; B81C 1/00031; C01B 2202/34; C01B 2202/36; B82Y 30/00
USPC ............ 428/167, 172, 323, 332, 402; 438/99; 204/456, 547; 977/842, 883
See application file for complete search history.

(56) References Cited

U.S. PATENT DOCUMENTS

| 4,728,591 | A | | 3/1988 | Clark et al. |
| 4,969,468 | A | * | 11/1990 | Byers et al. .................. 600/373 |

(Continued)

OTHER PUBLICATIONS

Yamamoto, et al., Orientation and purification of carbon nanotubes using ac electrophoresis, *J. Phys. D: Appl. Phys.* 31 No. 8 (L34-L36) (1998).

(Continued)

*Primary Examiner* — Donald J Loney
(74) *Attorney, Agent, or Firm* — Postemak Blankstein & Lund LLP

(57) ABSTRACT

The present invention provides methods and tools for directed assembly of nanoelements across a large area using a nanosubstrate. The nanosubstrate has a substrate layer, an adhesive layer, a conductive layer, and an insulating layer that is interrupted by one or more nanotrenches or nanowells having a width of at least 20 nm. The nanosubstrate allows the rapid assembly of linear assemblies and arrays of single walled carbon nanotubes and nanoparticles by DC electrophoresis. The density of nanoelements assembled can be controlled by varying the voltage and trench size. Functionalized nanoparticles can be assembled into arrays useful, e.g., as biosensors.

26 Claims, 12 Drawing Sheets

(51) Int. Cl.
*B81C 1/00* (2006.01)
*B82B 3/00* (2006.01)
*B82Y 30/00* (2011.01)
*B82Y 40/00* (2011.01)

(52) U.S. Cl.
CPC ......... *C01B2202/34* (2013.01); *C01B 2202/36* (2013.01); *Y10T 428/2462* (2015.01); *Y10T 428/2918* (2015.01)

(56) References Cited

U.S. PATENT DOCUMENTS

| | | | |
|---|---|---|---|
| 6,250,984 B1 * | 6/2001 | Jin et al. | 445/51 |
| 6,440,761 B1 * | 8/2002 | Choi | 438/20 |
| 6,455,439 B2 | 9/2002 | Sandhu | |
| 6,553,096 B1 * | 4/2003 | Zhou et al. | 378/122 |
| 6,630,772 B1 * | 10/2003 | Bower et al. | 313/311 |
| 6,911,767 B2 * | 6/2005 | Takai | 313/311 |
| 6,946,677 B2 * | 9/2005 | Ostergard | 257/40 |
| 6,987,071 B1 * | 1/2006 | Bollman et al. | 438/780 |
| 7,087,207 B2 | 8/2006 | Smalley et al. | |
| 2004/0176513 A1 * | 9/2004 | Cakmak et al. | 524/420 |
| 2005/0029514 A1 * | 2/2005 | Moriya | 257/40 |
| 2005/0037374 A1 * | 2/2005 | Melker et al. | 435/6 |
| 2005/0100499 A1 | 5/2005 | Oya et al. | |
| 2005/0202587 A1 * | 9/2005 | Redecker et al. | 438/99 |

OTHER PUBLICATIONS

Yamamoto, et al., Orientation of carbon nanotubes using electrophoresis, *Jpn. J. Appl. Phys.* vol. 35 (L917-L918) (1996) (Abstract Only).

* cited by examiner

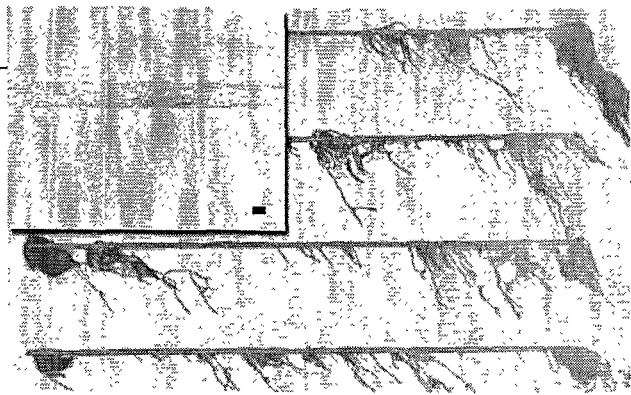
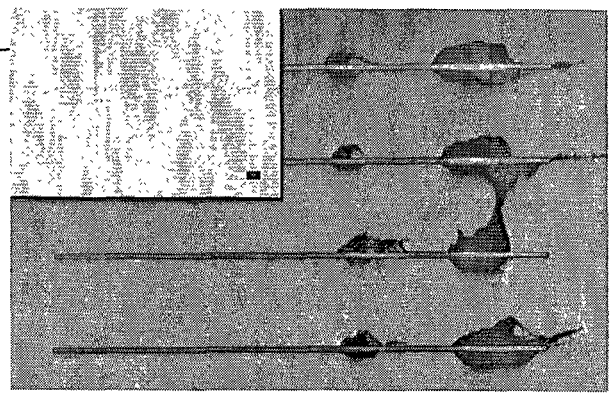
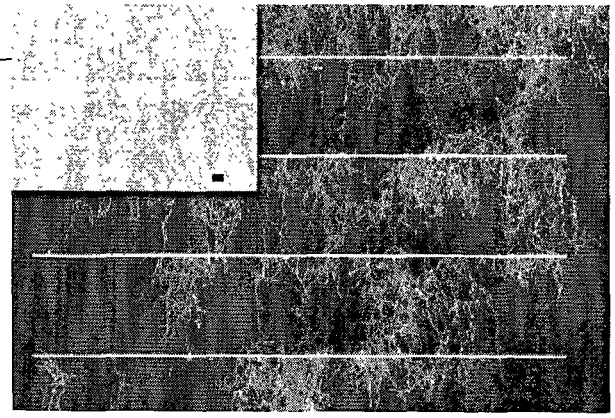

DIRECTED ASSEMBLY OF CARBON NANOTUBES AND NANOPARTICLES USING NANOTEMPLATES

CROSS REFERENCE TO RELATED APPLICATIONS

This application claims the priority of U.S. Provisional Application No. 60/741,421 filed Dec. 1, 2005 and entitled, DIRECTED ASSEMBLY OF CARBON NANOTUBES AND NANOPARTICLES USING NANOTEMPLATES WITH NANO-TRENCHES OR NANOWIRES, which is hereby incorporated by reference herein.

STATEMENT REGARDING FEDERALLY SPONSORED RESEARCH

The invention was made with support from Grant EEC-0425826 from the National Science Foundation Nanoscale Science and Engineering Center. The United States Government has certain rights in the invention.

BACKGROUND OF THE INVENTION

The fields of nanoscience and nanotechnology generally concern the synthesis, fabrication and use of nanoelements and nanostructures at atomic, molecular and supramolecular levels. The nanosize of these elements and structures offers significant potential for research and applications across the scientific disciplines, including materials science, physics, chemistry, computer science, engineering and biology. Biological processes and methods, for example, are expected to be developed based entirely on nanoelements and their assembly into nanostructures. Other applications include developing nanodevices for use in semiconductors, electronics, photonics, optics, materials and medicine.

One class of nanoelements that has garnered considerable interest consists of carbon nanotubes. P. Teredesai et al., "Pressure-Induced Reversible Transformation in Single-Walled Carbon Nanotube Bundles Studied by Raman Spectroscopy," Chem. Phy. Let., 319, 296-302 (2000). A carbon nanotube has a diameter on the order of nanometers and can be several micrometers in length. These nanoelements feature concentrically arranged carbon hexagons. Carbon nanotubes can behave as metals or semiconductors depending on their chirality and physical geometry.

Although carbon nanotubes have been assembled into different nanostructures, only limited nanotools and fabrication methods for their assembly have been developed. One obstacle has been the manipulation of individual nanoelements, which is often inefficient and tedious. This problem is particularly challenging when assembling complex nanostructures that require selecting and ordering millions of nanoelements across a large area.

Nanostructure assembly has focused on dispersing and manipulating nanoelements using atomic force or scanning tunneling microscopic methods. Although these methods are useful for fabricating simple nanodevices, neither is practical when selecting and patterning, for example, millions of nanoelements for more complex structures. As an alternative, lithographic methods have been developed to modify substrates used for assembling nanoelements. Examples of these lithographic methods include, but are not limited to, electron-beam, ion-beam, extreme ultraviolet and soft lithographies. These methods, however, remain incapable of manipulating individual nanoelements. The development of nanomachines or "nanoassemblers" which are programmed and used to order nanoelements for their assembly holds promise, although there have been few practical advancements with these machines.

Self-assembly is a method for nanodevice fabrication that does not require nanoelements to be individually manipulated. In self-assembly, nanoelements are designed to naturally organize into patterns by atomic, molecular and supramolecular particle interactions. Self-assembled monolayers, for example, are formed by the spontaneous arrangement of molecules into monomolecular layered structures. These structures can be stabilized by van der Waals forces or other forms of noncovalent bonding. Self-assembled monolayers, however, have been problematic when used to transfer nanoelements from one nanosubstrate to a recipient substrate. Although particle interactions can be modified to affect their transport, optical and electrical properties, controlling nanoelement orientation is also a challenge in self-assembly methods. Similarly, nanoscience has been incapable of manipulating particle interactions to reproducibly assemble hundreds of nanodevices.

The advancement of nanotechnology requires millions of nanoelements to be conveniently selected and simultaneously assembled. Nanostructure assembly also requires that nanoelements be ordered across a large area. Previously available methods such as those mentioned above have yet to meet these requirements.

Carbon nanotubes have shown promise as next generation switches or interconnects in electronic applications due to their unique electronic properties. The hindrance to the realization of electronic circuits with carbon nanotubes is the difficulty in positioning and contacting them in a controlled way on a large scale. One method that has been reported in the literature involves spinning a carbon nanotube suspension over a wafer. This produces a random dispersion of carbon nanotubes onto substrates which lack alignment. Another approach utilizes catalytic growth of nanotubes using catalyst particles. Self-assembly on chemically modified surfaces also has been used. These techniques, however, are not suitable for large scale controlled assembly of carbon nanotubes and other nanoelements.

Recently, assembly of carbon nanotubes and nanoparticles on patterned surfaces has been accomplished using electric fields. This process depends on the field generated by the voltage supplied to wires. Assembly of nanoelements works well when using microscale wires to generate the field. However, when the wires are reduced from diameters in the micron range to the nanometer range, their resistance increases by as much as two orders of magnitude. Previous attempts to direct the assembly process using DC electrophoresis with nanowires have failed.

SUMMARY OF THE INVENTION

The present invention is directed to methods and tools for the directed assembly of nanoelements on a patterned nanosubstrate by DC electrophoresis, as well as the products of the methods.

In one aspect, the invention provides a composition containing assembled or aligned nanoelements, such as carbon nanotubes or nanoparticles. The nanoelements are ordered on a larger scale than obtainable with previous methods, from the micron range to at least the cm range. One embodiment is a bundle of carbon nanotubes which has a diameter of 70 to 500 nm and a length of at least one cm.

Another aspect of the invention is a nanosubstrate for the directed assembly of nanoelements into large scale structures by electrophoresis. A nanosubstrate of the invention includes a substrate layer, an adhesion layer deposited on a surface of the substrate layer, a conductive layer deposited on the adhesion layer, and an insulating layer deposited on the conductive layer. The insulating layer is interrupted by one or more nanotrenches or nanowells having a width of at least 20 nm. The conductive layer, which serves as the anode during electrophoresis, is exposed at the bottom of the trenches or wells. During electrophoresis, the conductive layer causes the directed assembly of nanoelements, such as carbon nanotubes or nanoparticles, within the nanotrenches or nanowells. The resulting assemblies can be utilized, for example, in electrical and optical devices with special properties such as high strength or high electrical and thermal conductivity, or as biosensors.

Yet another aspect of the invention is a method for electrophoretically directing the assembly of nanoelements such as carbon nanotubes and nanoparticles onto structured substrates over a large scale. In an embodiment of this method, a nanosubstrate as described above is contacted with an aqueous suspension of nanoelements, such as carbon nanotubes or nanoparticles. A DC voltage is applied through the aqueous suspension between an anode and a cathode. The conductive layer of the nanosubstrate serves as the anode. The cathode is a conductor positioned in the aqueous suspension without touching the nanosubstrate. Nanoelements from the suspension are directed towards the anode and assemble within the trenches or wells of the substrate under the influence of the electric field. In certain embodiments, differently sized nanoparticles are selectively assembled within trenches or wells of different dimensions. The differently sized nanoparticles can be differentially functionalized, resulting in spatially distributed chemical groups that can be employed, for example, as an array or biosensor.

A further aspect of the invention is a method for making a nanosubstrate for the electrophoretic assembly of nanoelements. The method involves depositing an adhesion layer onto a surface of a substrate layer, depositing a conductive layer onto the adhesion layer, depositing an insulating layer onto the conducting layer, and creating a pattern of nanotrenches or nanowells in the insulating layer by lithography.

DESCRIPTION OF THE DRAWINGS

Other features and advantages of the present invention will be apparent from the following detailed description of the invention, taken in conjunction with the accompanying drawings of which:

FIG. 3A shows a field emission scanning electron micrograph (FESEM) of aligned carbon nanotubes, inside polymethylmethacrylate (PMMA) trenches, made using 5V/cm at pH 8; FIG. 3B (inset in FIG. 3A) shows carbon nanotubes made using the same conditions as in FIG. 3A, after the PMMA layer was removed using acetone; FIG. 3C shows carbon nanotubes made using 3 V/cm at pH 8; FIG. 3D (inset in FIG. 3C) shows carbon nanotubes made using the same conditions as in FIG. 3C, after the PMMA layer was removed using acetone; FIG. 3E shows carbon nanotubes made using 3 V/cm in isopropyl alcohol; FIG. 3F (inset in FIG. 3E) shows carbon nanotubes made using the same conditions as in FIG. 3E, after the PMMA layer was removed using acetone;

FIG. 7 shows the effect of voltage when using 80 nm trenches; In FIG. 7A 3 V/cm was applied for 1 minute, and in FIG. 7B 5 V/cm was applied for 1 minute; Scale bars represent 200 nm for FIG. 7A and 20 nm for FIG. 7B;

FIG. 12 shows a schematic illustration of nanoscale electrophoretic deposition of negatively charged nanoparticles onto a PMMA patterned anode nanosubstrate.

DETAILED DESCRIPTION OF THE INVENTION

The present invention provides a technique to assemble nanoelements using a patterned nanosubstrate in a controlled and precise manner using DC electrophoresis. This method can assemble nanotubes and nanoparticles, for example, over larger dimensions (cm scale) than previously possible, and in a brief time (minutes). Furthermore, previous techniques required using wires having diameters in at least the micron range for generating the electric field. When wires having diameters in the nanometer range are used, however, their higher resistance decreases the field to the point that nanoelements cannot be assembled. With the present invention, however, nanoscale conductors can be employed to align and assemble nanoelements by DC electrophoresis.

The present inventors have developed a nanosubstrate having a conductive film that drives the patterned assembly of nanoelements using large area films placed at the bottom of a nanotrench or nanowell. Without limiting the invention to any particular mechanism, it appears that the large area configuration of the conducting film present in the nanosubstrate according to the invention provides a resistance comparable to that of a microwire, allowing sufficient field strength for assembly to be driven by DC electrophoresis.

Figure 1A:
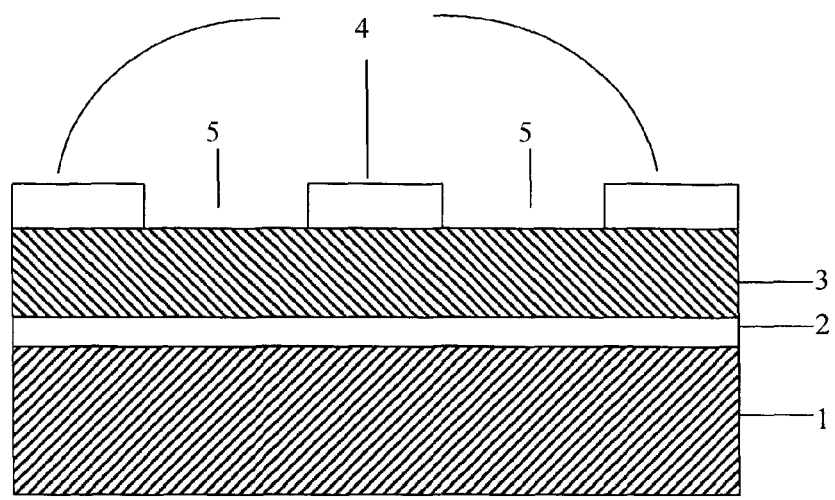
FIG. 1A is a cross-sectional schematic representation of a nanosubstrate embodiment.
Figure 1B:
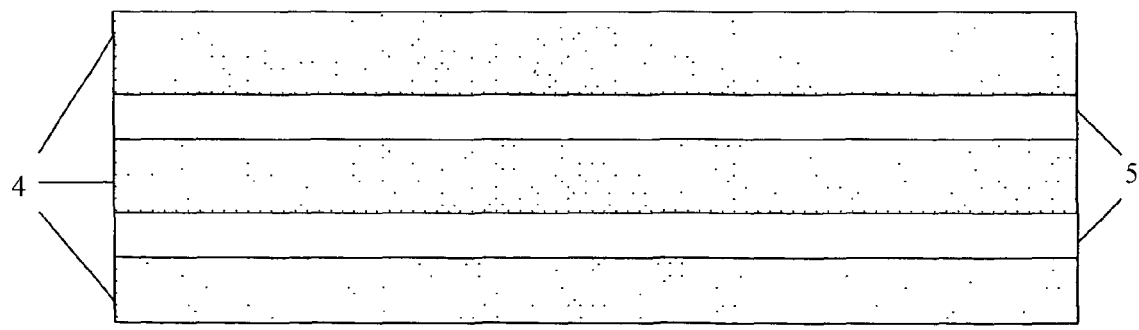
FIG. 1B is a top view schematic representation of the nanosubstrate embodiment of FIG. 1A.

Massive directed assembly of nanoelements by DC electrophoresis is made possible by using nanotrench- or nanowell-based electrical field templates (nanosubstrates). FIGS. 1A and 1B presents schematic representations of a nanosubstrate of the invention. FIG. 1A shows a cross-section and FIG. 1B shows the surface of the substrate that is exposed to the suspension containing nanoelements for assembly. The base layer of the nanosubstrate is the substrate layer 1. Deposited onto the substrate layer is a thin adhesion layer 2. A conductive layer 3 is in turn deposited onto the adhesion layer. Finally, an insulating layer 4 is deposited onto the conductive layer. The insulating layer is interrupted by one or more nanotrenches 5 or nanowells 5 that allow the conductive layer to be exposed to the solution above the nanosubstrate. The exposed regions of the conductive layer form an electrode for DC electrophoresis; in a preferred embodiment, this is the anode. The other electrode is placed into the liquid suspension of nanoelements.

Nanoelements for use in the invention include, for example, nanocrystals, dendrimers, nanoparticles, nanowires, biological materials, proteins, molecules and organic nanotubes. Preferred nanoelements are single walled carbon nanotubes and nanoparticles.

Figure 2A:
FIG. 2A is a schematic representation of a process of making a nanosubstrate.

Nanosubstrates of the invention are made by sequentially depositing an adhesion layer, a conductive layer, and an insulating layer onto the substrate layer, and then removing selected areas of the insulating layer by lithography. See FIG. 2A for a schematic representation of the process. For example, in one embodiment a 15 mm×15 mm piece of silicon dioxide served as the substrate layer, upon which a 6 nm layer of Cr was deposited as the adhesion layer. A 40 nm layer of Au was deposited onto the Cr layer as the conductive layer. Finally, an 85 nm thick film of PMMA was spun onto the Au layer, followed by electron-beam lithography to make nanoscale trenches in the insulating layer.

The base layer of a nanosubstrate is the substrate layer. The substrate layer typically extends the length and width of the nanosubstrate and provides structural rigidity. The substrate layer supports the other layers which are added to one surface of the substrate layer. The thickness of the substrate layer is not critical for most applications, and can range, for example from 100 nm to several cm or more. A wide variety of non-conducting materials can be used for the substrate layer of a nanosubstrate. Silicon wafers, for example, are capable of being used as a substrate layer. A preferred material is silicon dioxide ($SiO_2$, also referred to as silicon oxide). Other suitable materials include organic or inorganic insulating materials, e.g., non-conducting oxides. It is important that the substrate layer be electrically insulating so that it does not provide current leak pathways that might alter the intended electric field distribution for nanoelement assembly. It is also important that the substrate layer be structurally rigid so that the nanoscale structural features of the insulating layer are stably preserved with respect to one another. Preferably, the substrate layer of a nanosubstrate has a smooth surface topology. The substrate layer can be formed by available methods for cutting, polishing, molding, or polymerizing suitable materials, as is well known in the art. The substrate layer can have any desired shape or thickness, but is preferably a thin sheet or film having an approximately flat surface on at least one side upon which the other layers can be deposited. The two-dimensional shape outlined by the surface of the substrate layer that receives the additional layers of the nanosubstrate can be, for example, circular, rectangular, square, irregular, or another shape.

In a nanosubstrate of the invention, the substrate layer has three additional layers adsorbed onto one of its surfaces. These layers can be deposited by any method that provides a generally homogeneous, thin layer with good molecular contact and adhesion to adjacent layers. For example, chemical vapor deposition and physical vapor deposition are suitable methods for depositing metals. A preferred method for depositing metals is sputtering. Polymers such as PMMA can be deposited in the liquid state, for example, by spin coating. If appropriate, suitable methods can be employed to harden the polymer layer, e.g., exposure to heat, light, or chemicals.

The adhesion layer is a thin film that promotes the optimal adhesion of the conductive layer to the substrate layer. The adhesion layer therefore serves to prevent the conductive layer from becoming detached or broken during electrophoresis, particularly at higher voltages which can damage or detach the conductive layer. Examples of materials suitable for use in the adhesion layer are chromium, titanium, and titanium oxide. Any material that can be deposited in a thin film and gives strong adhesion between the substrate layer and the conductive layer can be use for the adhesion layer. The adhesion layer is generally less conductive than the conductive layer. The adhesion layer can be any thickness compatible with its role in promoting adhesion of the conductive layer to the substrate layer. Thin layers are generally better for this function; layers of 3 nm to 6 nm thickness are preferred.

The conductive layer establishes a uniform electric field that drives the assembly of nanoelements on the nanosubstrate. Suitable materials for the conductive layer include any highly conductive metals or metal oxides, such as gold or aluminum. The thickness of the conductive layer is chosen in order to minimize resistance, provide adequate conductivity and a uniform electric field, and good adhesion to adjacent layers. The thickness is preferably in the range of 50 nm to 100 nm. An alternative to using a gold or other metallic conductive layer is to use a conductive polymer such as polyanaline. In this way, a completely biocompatible device can be made, such as a sensor or array for implantation in an animal body or for analysis of metal sensitive proteins in vitro or in vivo.

An insulating layer is added onto the conductive layer, followed by lithography (e.g., electron-beam lithography) to make nanoscale trenches (either linear or curved) or nanoscale wells. Following exposure, a portion of the insulating layer is removed (e.g., PMMA film is dissolved in acetone) and, after rinsing in deionized water, the gold surface is exposed for the electrical connection. The plain conductive gold surface ensures that a uniform potential is applied underneath the patterned insulating layer, and the electric field distribution is controlled by the patterned insulating PMMA film. The patterns of nanotrenches or nanowells formed by lithography leave desired areas of the conductive layer exposed to the fluid environment containing dispersed nanoelements and determine the pattern of alignment and assembly of nanoelements during electrophoresis. This design has the advantage of achieving consistent assembly over a large area wherever the potential and geometric design of nanotrenches or nanowells are the same. Nanotrenches or nanowells are at least 20 nm in width or diameter. In certain embodiments, the nanotrenches or nanowells are also less than 100000 nm, 10000 nm, 1000 nm, or 500 nm in width or diameter. Nanotrenches can be at least 50 nm in length, and in certain embodiments can be at least 100 nm, 500 nm, 1000 nm, 10000 nm, 100000 nm or more in length.

In forming the insulating layer, an electrically insulating material either is deposited directly onto the conductive layer in a liquid state. A monomeric material can be used to coat the conductive layer, followed by polymerization of the monomer by any of a variety of methods. These methods include, but are not limited to, free radical polymerization, photopolymerization, anionic polymerization and cationic polymerization. Polymeric liquids also can be used to insulate the conductive layer, for example, by thermal treatment or photocuring. Any insulating material compatible with a suitable lithography process can be used. A preferred material is PMMA. The thickness of the insulating layer must be sufficient to provide good electrical insulation, so as not to attract charged nanoelements to unintended areas of the nanosubstrate, and will depend on the dielectric properties of the material. The thickness must also be compatible with complete removal by lithography to expose the conducting layer. A preferred range of thickness for the insulating layer is 80 nm to 150 nm.

Any lithographic process capable of selectively removing desired areas of the insulating layer and exposing the conductive layer beneath can be used. Although numerous lithographic methods have been developed for nanoscale applications, the invention preferably uses electron-beam, ion-beam, ultraviolet, extreme ultraviolet or soft lithographies. Comparable methods such as holographic, nanoimprint, immersion or interference lithographies can also be used. Generally, a nanosubstrate patterned by one of the above methods features surface depressions or recesses, usually in the form of nanotrenches or nanowells, resulting in exposure of the underlying conductive layer.

A variety of patterns can be created by lithography of the insulating layer of a nanosubstrate of the invention, depending on the geometry of the nanoelements being assembled and the desired end product. Nanotrenches are linear depressions that can be straight or curved as well as intersecting or non-intersecting. Nanowells are approximately circular, square, or rectangular depressions. The nanotrenches or nanowells on a given nanosubstrate can have similar dimensions or different dimensions. The assembly by DC electrophoresis of nanoelements on a nanosubstrate is similar regardless of which type of pattern is present in the insulating layer.

Figure 12A:
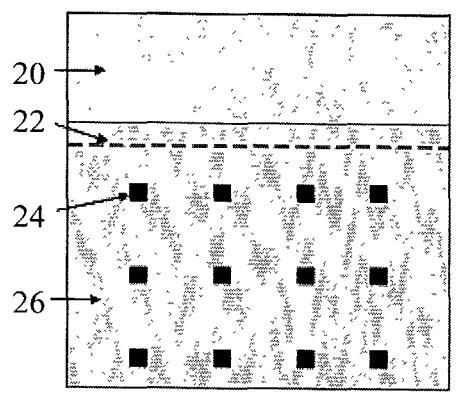
FIG. 12A shows the nanosubstrate with nanowells.
Figure 12B:
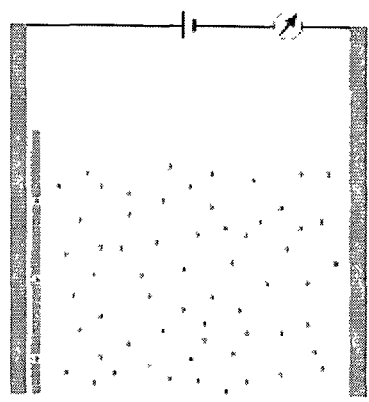
FIG. 12B shows the assembly of nanoparticles into the nanowells.
Figure 12C:
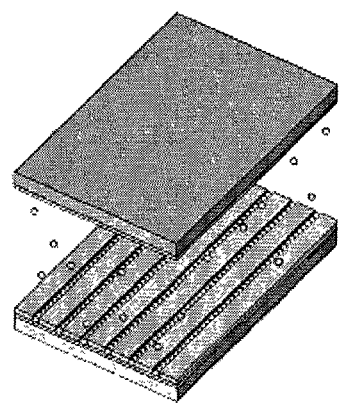
FIG. 12C shows a nanosubstrate having nanotrenches filled with aligned nanoparticles following electrophoresis.

Two different embodiments for the assembly of nanoparticles are depicted in FIG. 12. In the first embodiment, the nanosubstrate 26 shown in FIG. 12A contains an array of nanowells 24 that are submerged in a liquid suspension of nanoparticles up to position 22, such that all of the nanowells are covered by the suspension. A section of the conducting layer 20 is left exposed (i.e., not covered with an insulating layer) for contact with the voltage source. FIG. 12B shows the process of electrophoretic transfer of the nanoparticles from the suspension onto the nanosubstrate (the electrode on the left); another substrate layered with an uninsulated conductive layer serves as the second electrode (right side). In the second embodiment, nanoparticles are assembled into a linear array using the same process, but using a nanosubstrate with nanotrenches instead of nanopores (FIG. 12C).

Lithographically constructed patterns formed on individual nanosubstrates can be combined to make larger patterns. For example, in one embodiment each exposed pattern occupies an area of about 100 µm×100 µm, and combined patterns of 12 such exposures have been made. There is in principle no upper limit to the pattern size, or to the width or length of assembled nanoelements that can be made.

Figure 2B:
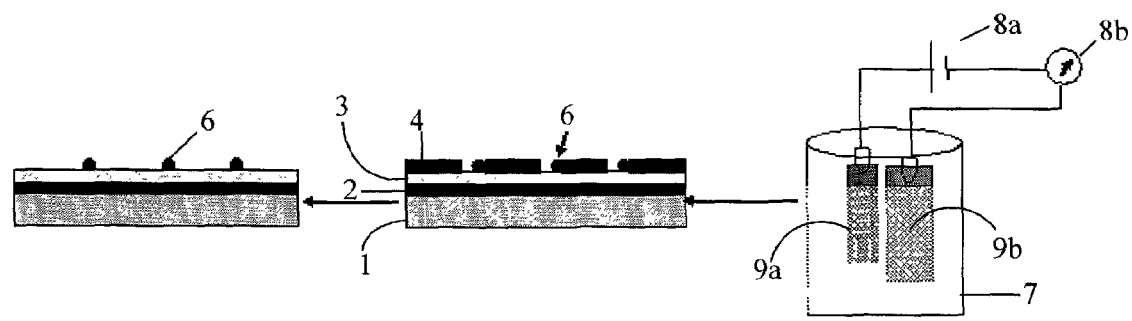
FIG. 2B is a schematic representation of a process of assembly of carbon nanotubes by DC electrophoresis using a patterned nanosubstrate.
Figure 4A:
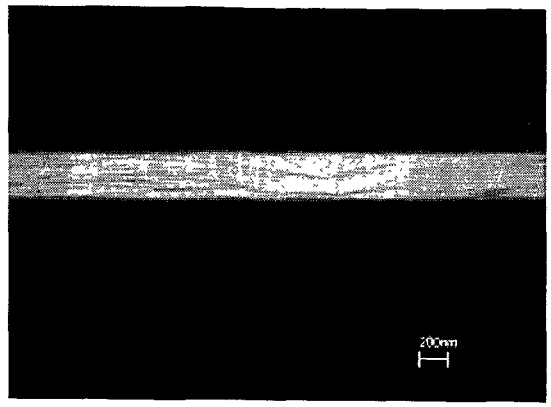
FIG. 4A shows assembled SWNT inside a 250 nm trench.
Figure 4B:
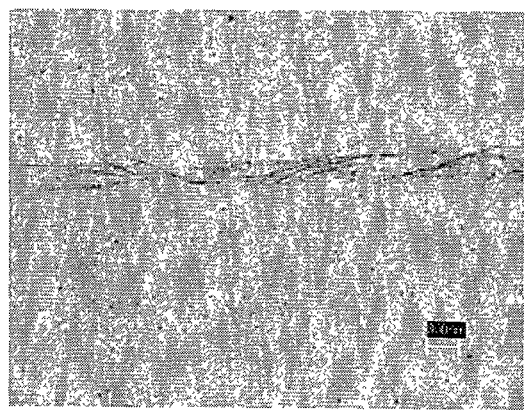
FIG. 4B shows the nanotube bundle after dissolving the PMMA layer with acetone; Assembly was carried out at 3 V/cm; Scale bars represent 200 nm.

The invention is also directed to methods for directing the assembly of nanoelements such as carbon nanotubes and nanoparticles on structured substrates using DC electrophoresis. The general method is depicted schematically in FIG. 2B. The method employs a nanosubstrate as described above to generate a nanopatterned electric field in a liquid suspension 7 containing charged nanoelements. The field is established by connecting a DC voltage source 8a to the nanosubstrate 9a as one electrode and to a second electrode 9b. Optionally, an ammeter 8b can be used to track current flow during assembly. The field causes the movement by electrophoresis of the nanoelements toward the nanosubstrate. Preferably, conditions are selected such that the nanoelements carry a negative charge, in which case they will migrate toward the anode during electrophoresis. If the conductive layer of the nanosubstrate is chosen as the anode, then nanoelements from the liquid suspension will accumulate and form an assembly 6 on the conductive layer inside the nanotrenches or nanowells formed by the insulating layer. If desired, the assembly can be exposed or removed from the nanosubstrate by eliminating the insulating layer (e.g., dissolving a PMMA layer with acetone and rinsing with deionized water).

Nanoelements including carbon nanotubes and PSL or silica nanoparticles typically have a net charge at pH values above or below their isoelectric points. At a pH above the isoelectric point, nanoelements will be negatively charged. Therefore, in a preferred embodiment, the pH of the nanoelement suspension is adjusted to above the isoelectric point of the nanoelements, and the conductive layer of the nanosubstrate is used as the anode and will attract the particles when a voltage is applied. Alternatively, the pH of the suspension can be set to below the isoelectric point of the nanoelements, and the conductive layer of the nanosubstrate is used as the cathode.

Regardless of the polarity of the conductive layer of the nanosubstrate during electrophoresis, the other electrode (second electrode) is placed into the suspension at some known distance from the nanosubstrate. For example, if the conductive layer of the nanosubstrate is the anode, then the cathode will be present in the nanoelement liquid suspension, for example at a distance of 1 cm removed from the nanosubstrate. It is important to provide a uniform electric field between the conductive layer of the nanosubstrate and the second electrode. This can be accomplished by assuring that the other electrode is equidistant from the nanosubstrate over the full area of the nanosubstrate. For example, if the nanosubstrate is a planar rectangle, then the second electrode should also be planar and arranged parallel to the entire exposed area of the conductive layer of the nanosubstrate. The second electrode can be fabricated of any appropriate conductive material, but a preferred electrode is fabricated of the same material as the conductive layer of the nanosubstrate (e.g., a gold film on a substrate).

The nanoelement suspension used as a feed source for assembly is preferably an aqueous suspension; however, other liquids such as alcohols or other polar solvents can be used, as can mixtures of water and other aqueous solvents. The suspension preferably contains a sufficient ionic strength such that some level of charge screening occurs at charged positions on the nanoelements. Otherwise, aggregation or nonspecific binding of the nanoelements can occur, which would prevent their orderly assembly at the nanosubstrate. In one embodiment, a small amount of ammonium hydroxide solution, resulting in a final concentration in the range of about 0.5 to 1 µM, is added to a deionized water suspension of nanoelements. This provides both the requisite ionic strength and sets the pH of the solution to the desired range of 7-8.

The conductive layer of the nanosubstrate is connected to a regulated DC power supply, preferably one providing constant voltage adjustable in the range of 1-5 V/cm between the electrodes. Electrical connection with the connective layer of the nanosubstrate can be established by a variety of conventional techniques. One suitable method is to leave a portion of the conductive layer exposed (i.e., without any overlaying insulating layer) at an edge of the nanosubstrate so that electrical contact with the conductive film can be made. In general, the stronger the electric field, the more rapid assembly will take place. A threshold voltage may exist below which no assembly occurs, and too high a voltage will lead to breakdown of the conductive layer with subsequent disruption of assembly. Smaller dimensions of the nanotrenches or nanowells generally requires a higher voltage to drive assembly. An appropriate voltage for a given set of conditions is readily determined by trial.

Figure 11:
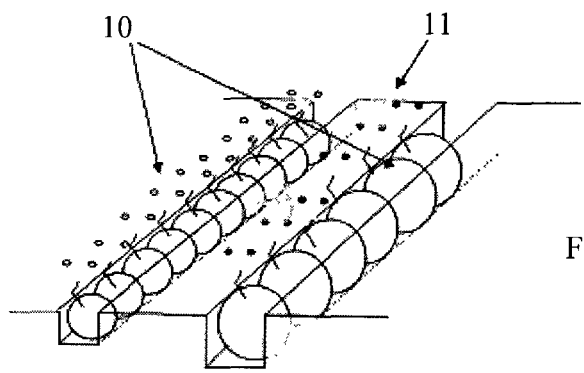
FIG. 11 schematically depicts an embodiment in which differently sized nanoparticles are assembled into a trench of matching width; Each size class of nanoparticle is bound to a different type of antibody, allowing detection of specific antigen binding.

An embodiment of the invention is a method of making an assembly comprising nanoelements of two or more different size classes. A nanosubstrate is fabricated with nanotrenches or nanopores of two or more different widths. Nanoelements of different size classes are assembled on the nanosubstrate in decreasing order of size. In each cycle, nanoelements of a size class are assembled in a nanotrench or nanopore of similar or slightly greater size as the average width or diameter of the nanoelements. In that way, each size class of nanoelements can be targeted to one or more specific nanotrenches or nanopores. In certain embodiments, nanoelements belonging to different size classes can be differentially functionalized, resulting in spatially distributed chemical groups that can be employed, for example, as an array or biosensor. For example, in the embodiment depicted in FIG. 11, two different size classes of nanoparticles 10 are assembled in nanotrenches of different widths. Each of the nanoparticle classes has been functionalized and bound to a different type of antibody or fragment of an antibody. When an antigen 11 is present which binds to one of the antibody types, but not the other, a specific signal is generated that indicates the presence and identity of the antigen. For example, a second antibody that binds to the antigen and possesses a bound label, such as a fluorescent tag or an enzyme, can be used to detect antigens bound to the nanosubstrate. A nanosubstrate having suitably functionalized nanoparticles with bound antibodies can serve as a biosensor or detector array. For example, such a nanosubstrate can be surgically placed or injected into an animal, where it can detect specific proteins or cells that signal the presence or progression of a disease (e.g., a specific type of cancer).

EXAMPLES

Example I

Manufacturing a Nanosubstrate for Carbon Nanotube Assembly

A 5 nm layer of Cr was deposited by sputtering onto an oxidized silicon surface. A 50 nm layer of Au was then deposited by sputtering over the Cr layer. A 150 nm thick PMMA layer was then spun over the surface. Electron beam lithography was used to pattern nanotrenches of various sizes (see subsequent examples) in the PMMA layer. Following exposure, the substrate was developed resulting in the formation of nanotrenches on the PMMA film exposing parts of the gold surface.

Example II

Assembly of Carbon Nanotube Bundles

The nanosubstrate from Example I was immersed in a 10 ml suspension of 0.01 wt/vol % single wall carbon nanotubes (SWNT) in deionized water. The SWNT were obtained from Carbon Nanotechnologies, Inc. (Houston, Tex.). The pH of the solution was adjusted to 8 by adding ammonium hydroxide solution (final concentration approximately 1 µM). A clean gold substrate placed at a distance of 1 centimeter from the PMMA substrate acted as the cathode. A DC voltage was applied between the two electrodes for 60 seconds, and the current was monitored using a pico-ammeter. An electric field of either 5 V/cm (FIG. 3A) or 3 V/cm (FIG. 3C) resulted in the negatively charged nanotubes being assembled inside the trenches wherever the gold layer was exposed. There were some nanotubes protruding out of the trench, especially at the edges, but these were removed after the PMMA was dissolved (see below).

Following assembly, the PMMA film was stripped using acetone. After removing the PMMA layer, the nanotubes remained intact on the gold surface and oriented in the same location as they were assembled, as shown in FIGS. 3B and 3D.

When isopropyl alcohol (IPA) was used in place of deionized water for the suspension of nanotubes, electrophoresis for 60 seconds at 3 V/cm did not result in assembly of nanotube bundles within the nanotrenches. As seen in FIG. 3E (and FIG. 3F following PMMA dissolution with acetone), the nanotubes remained disoriented and distributed across the surface of the nanosubstrate. This might be due to the tendency of nanotubes to agglomerate in IPA.

Example III

Effect of Trench Width on Assembly of Carbon Nanotubes

To investigate the effect of trench width on assembly, nanosubstrates were fabricated with 70 µm long trenches having widths of approximately 350 nm, 250 nm, 150 nm, 100 nm and 50 nm. As seen from the results presented in FIGS. 4-7, the density of nanotubes assembled inside the trenches decreased with the width of the trenches for a given voltage.

Example IV

Effect of Voltage on Assembly of Carbon Nanotubes

Figure 5A:
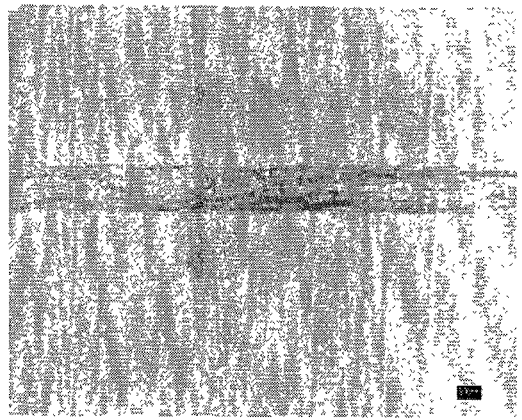
In FIG. 5A assembly was driven at 5V/cm, and in FIG. 5B assembly was driven at 3V/cm, both using 250 nm wide trenches; Scale bars represent 200 nm.
Figure 5B:
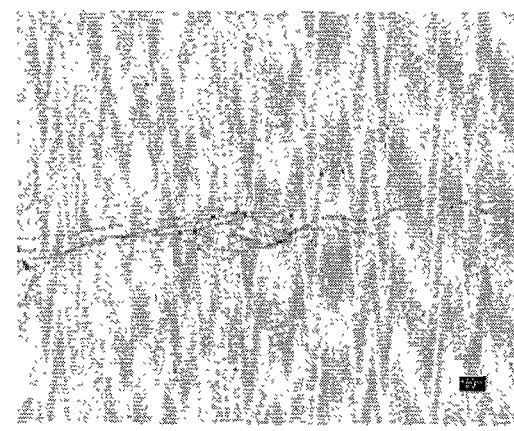
FIG. 5 shows the effect of voltage on the assembly of SWNT.
Figure 6A:
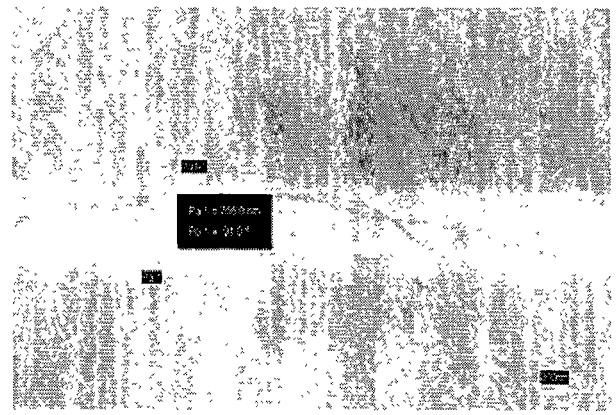
FIG. 6 shows the effect of trench size (trench width 350 nm in FIG. 6A and 140 nm in FIG. 6B); The voltage in each case was 3 V/cm; Scale bars represent 300 nm for FIG. 6A and 200 nm for FIG. 6B.
Figure 6B:
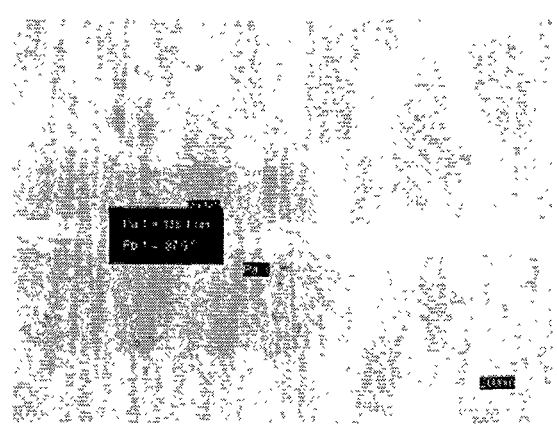
Figure 7A:
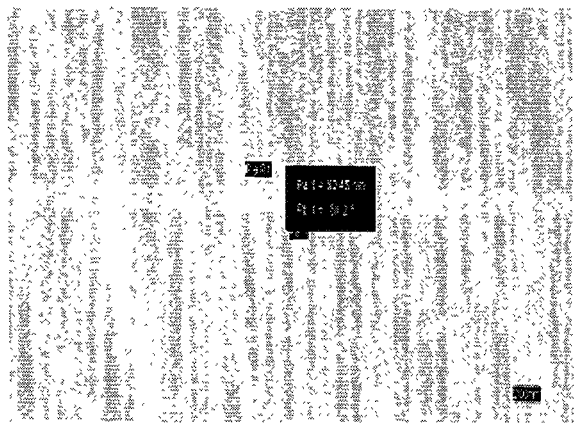
Figure 7B:
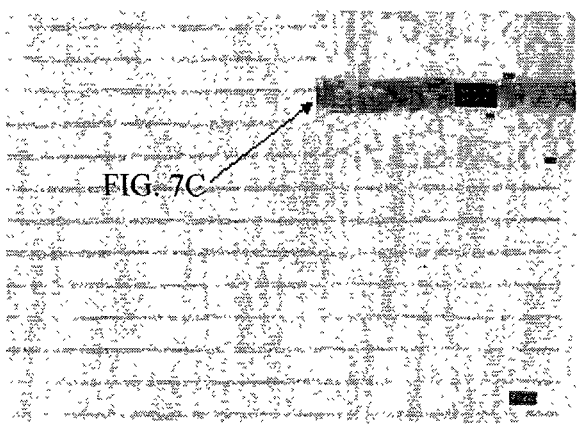
Figure 8A:
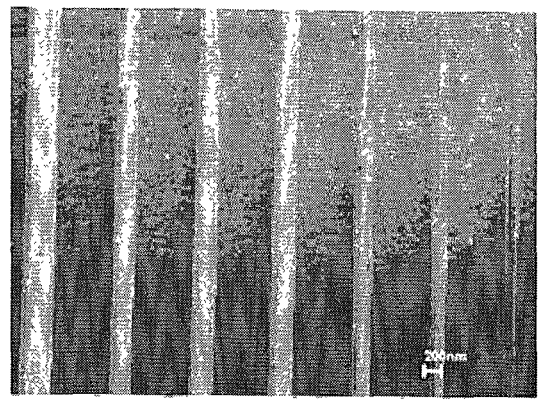
FIG. 8 shows that nanoparticles as small as 15 nm could be assembled in 20 nm trenches without any gaps; The electric field was 1.5 V/cm in FIG. 8A and 2 V/cm in FIG. 8B (scale bars represent 200 nm)
FIG. 8C shows the time dependence of current flow at 1.5, 2, 2.5, and 3 V/cm (traces from bottom to top, respectively)
Figure 8B:
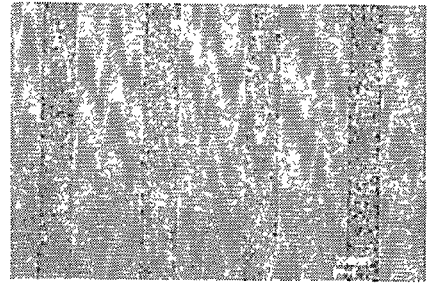
Figure 8C:
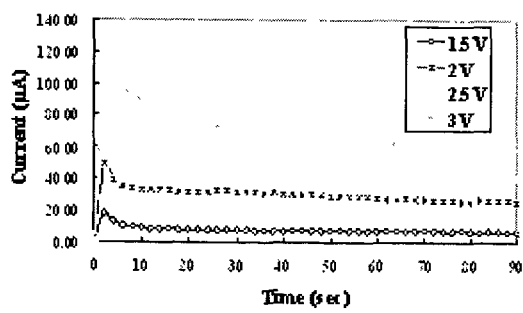
Figure 9:
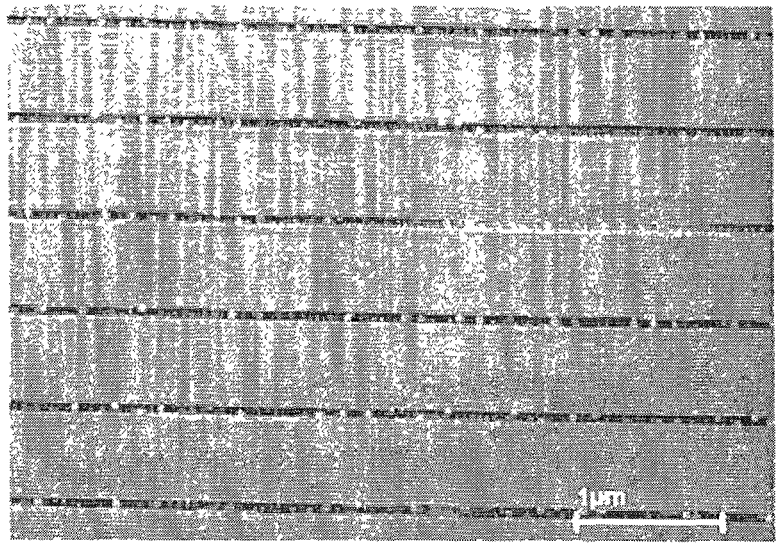
FIG. 9 shows the result of assembling 50 nm polystyrene latex (PSL) nanoparticles in 50 nm wide trenches; A continuous line of particles is visible at the bottom of the trenches, with a few particles visible as a second layer above the first layer.

To investigate the effect of voltage on assembly, the nanosubstrates fabricated for the experiment in Example III were used for assembly driven by an electric field ranging from As seen from the results presented in FIGS. 5 and 7, the density of nanotubes assembled inside a trench of given width was higher when the voltage was increased.

Example V

Assembly of Nanoparticles on Patterned Nanosubstrates

Monodispersed polystyrene latex (PSL) nanoparticles that ranged in diameter from 50 nm-10 nm (obtained from Duke Scientific, Inc.) were diluted in deionized water with a pH value adjusted to 10-11 by adding ammonium hydroxide solution. Colloidal nanoparticles such as PSL and silica particles (also obtained from Duke Scientific, Inc., Palo Alto, Calif.) have negative zeta potentials at high pH values (9-11) in an aqueous solution, and as a result are negatively charged. The electrophoretic assembly experiments were performed by connecting the PMMA patterned gold nanosubstrate (anode) and a bare gold substrate (cathode) to a DC voltage source and dipping them vertically into the particle suspension with a separation between the electrodes of 1 cm. FIGS. 12B and 12C schematically illustrate the assembly of negatively charged colloidal particles onto the PMMA patterned gold substrate.

Figure 10:
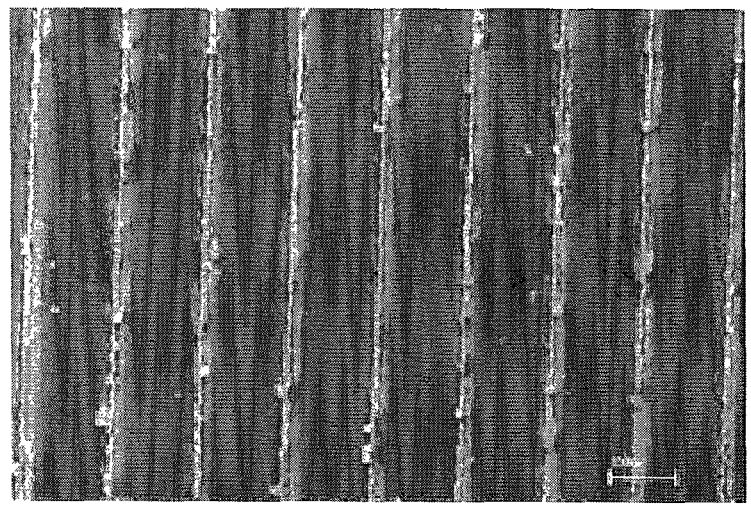
FIG. 10 shows the result of assembling 10-15 nm PSL nanoparticles in 30 nm wide trenches (scale bar represents 100 nm); A continuous line of particles is visible at the bottom of the trenches.
Figure 13A:
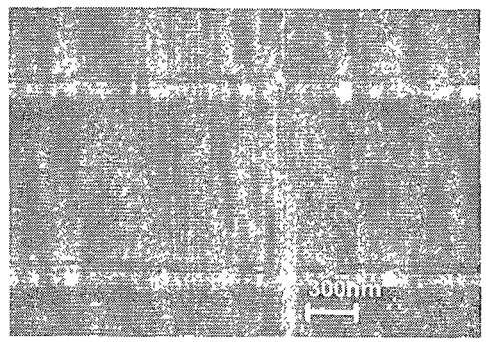
FIG. 13A shows a cross pattern of aligned nanoparticles; 13B shows curved and linear aligned nanoparticle assemblies.
Figure 13B:
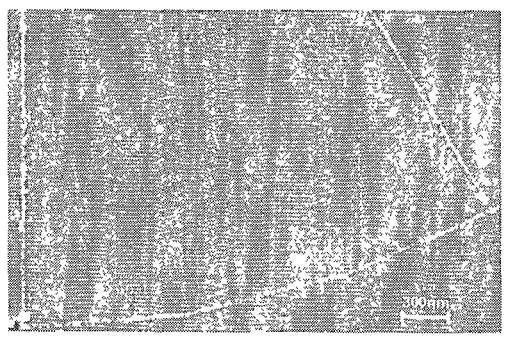
FIG. 13 shows FESEM images of 10-15 nm wide single nanoparticle lines assembled in 30 nm wide PMMA trenches using 2V/cm for 90 s.

FIG. 10 shows that single nanoparticle lines of 10-15 nm wide were assembled in 30 nm wide trenches using 2V/cm for 90 seconds. The assembled nanoparticles were in continuous, linearly aligned arrangement within the nanotrenches. A more complex cross-line nanoparticle structure also was fabricated using this one-step assembly process (FIG. 13A), proving that the directed assembly is independent of the trench orientation with respect to the template dipping direction. Curved single nanoparticle lines also were assembled (FIG. 13B).

Figure 14A:
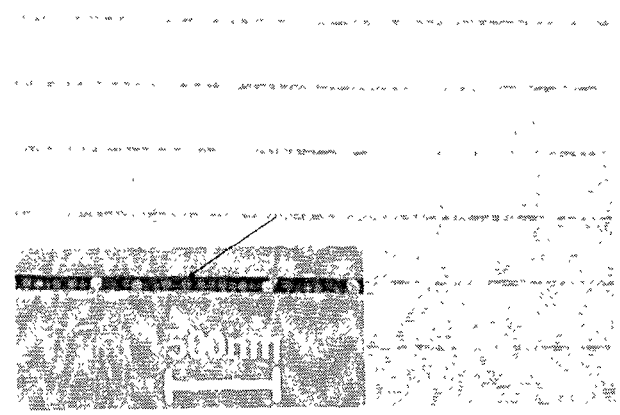
FIG. 14 shows FESEM images of 50 nm PSL particles assembled in (FIG. 14A) 50 nm wide trenches using 2V/cm for 90 s, (FIG. 14B) trenches with varying widths using 2V/cm for 90 s, and (FIG. 14C) 260 nm wide trenches using 3V/cm for 90 s.
Figure 14B:
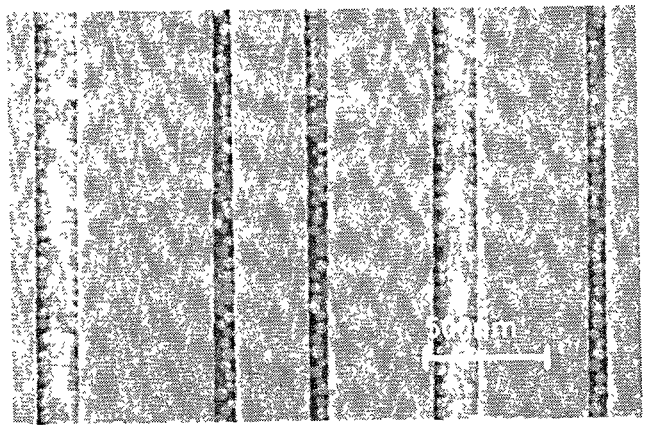
Figure 14C:
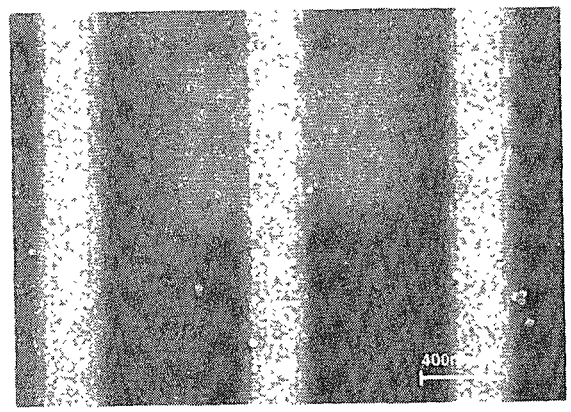

Increasing the nanotrench width to 50 nm allowed the capture of larger size particles into particle lines (FIG. 14A-C), demonstrating that the template assisted electrophoretic assembly method is scalable. Using 2V voltage for 90 s, the 50 nm wide trenches were near fully covered with a first layer of single nanoparticles packed into an array at the trench bottom; a few second layer particles were deposited on top of the first layer of particle lines (see FIG. 14A). This is due to the fact that the assembled particles are insulating and they shield the gold at the bottom of the trench resulting in a much weaker electric field.

While the present invention has been described in conjunction with a preferred embodiment, one of ordinary skill in the art, after reading the foregoing specification, will be able to effect various changes, substitutions of equivalents and other alterations to the compositions and articles set forth herein. It is therefore intended that the protection granted by Letter Patent hereon be limited only by the definitions contained in the appended claims and equivalents thereof.

What is claimed is:

1. A nanosubstrate comprising one or more electrophoretically assembled, essentially spherical nanoparticles, the nanosubstrate comprising a substrate layer, an adhesion layer deposited on a surface of said substrate layer, a substantially planar conductive layer deposited on said adhesion layer, and an insulating layer consisting essentially of an insulating material deposited on said conductive layer, said insulating layer interrupted by one or more nanotrenches each comprising a curved or straight linear depression and having a width of at least 20 nm, wherein said one or more electrophoretically assembled, essentially spherical nanoparticles are disposed within said nanotrenches in contact with said conductive layer.

2. The nanosubstrate of claim 1 wherein said one or more nanotrenches have a width in the range of 20 nm to 500 nm.

3. The nanosubstrate of claim 1, wherein the substrate layer comprises an organic or inorganic insulator.

4. The nanosubstrate of claim 3, wherein the substrate layer comprises silicon dioxide.

5. The nanosubstrate of claim 1, wherein the adhesion layer comprises a material selected from the group consisting of chromium, titanium, titanium oxide, and any combination thereof.

6. The nanosubstrate of claim 1, wherein the conductive layer comprises an organic or inorganic conductor.

7. The nanosubstrate of claim 6, wherein the conductive layer comprises a material selected from the group consisting of gold, aluminum, copper, polyanaline, and any combination thereof.

8. The nanosubstrate of claim 1, wherein the insulating layer comprises a photoresist material compatible with a lithographic method.

9. The nanosubstrate of claim 8, wherein the photoresist material is polymethylmethacrylate.

10. The nanosubstrate of claim 1, wherein the substrate layer is silicon dioxide, the adhesion layer is chromium, the conductive layer is gold, and the insulating layer is polymethylmethacrylate.

11. The nanosubstrate of claim 1, wherein the thickness of the adhesion layer is 3 nm to 6 nm.

12. The nanosubstrate of claim 1, wherein the thickness of the conductive layer is 40 nm to 100 nm.

13. The nanosubstrate of claim 1, wherein the thickness of the insulating layer is 80 nm to 150 nm.

14. The nanosubstrate of claim 1, wherein said nanoparticles are bound to an antibody or a fragment thereof.

15. The nanosubstrate of claim 1, comprising two or more nanotrenches having different widths.

16. The nanosubstrate of claim 15, further comprising two or more nanoparticles deposited in said two or more nanotrenches, the nanoparticles belonging to two or more different size classes, wherein the nanoparticles in each size class have a diameter less than or equal to the width of the nanotrench in which they are deposited.

17. The nanosubstrate of claim 16, wherein the nanoparticles of each size class are covalently bound to a different antibody or fragment thereof.

18. The nanosubstrate of claim 1 comprising one or more nanotrenches, wherein said nanotrenches are at least 10,000 nm in length and are substantially filled with said electrophoretically assembled, essentially spherical nanoparticles along their entire length.

19. The nanosubstrate of claim 18 wherein said nanotrenches are at least 100,000 nm in length and are substantially filled with said electrophoretically assembled, essentially spherical nanoparticles along their entire length.

20. The nanosubstrate of claim 1, comprising one or more curved nanotrenches and the curved nanotrenches are substantially filled with said electrophoretically assembled, essentially spherical nanoparticles along their entire length.

21. The nanosubstrate of claim 1, comprising two or more intersecting nanotrenches, and the intersecting nanotrenches are substantially filled with said electrophoretically assembled, essentially spherical nanoparticles along their entire length.

22. The nanosubstrate of claim 1, comprising two or more linear nanotrenches arranged in parallel, and two or more adjacent nanotrenches of said linear nanotrenches arranged in parallel comprise nanoparticles of different sizes.

23. The nanosubstrate of claim 1, wherein each nanotrench contains nanoparticles bound to an antibody or fragment thereof having binding specificity for the same antigen.

24. The nanosubstrate of claim 23, wherein two or more nanotrenches contain nanoparticles bound to antibodies or fragments thereof having binding specificity for different antigens.

25. The nanosubstrate of claim 1, comprising at least one nanotrench wherein said nanoparticles are arranged in a linear arrangement one nanoparticle wide along essentially the entire length of said nanotrench.

26. The nanosubstrate of claim 25, wherein the nanotrench having a linear arrangement of nanoparticles is straight, curved, or intersects with another nanotrench having a linear arrangement of nanoparticles.

\* \* \* \* \*